United States Patent
Kamada et al.

(10) Patent No.: US 9,766,384 B2
(45) Date of Patent: *Sep. 19, 2017

(54) ANTIREFLECTION FILM AND ORGANIC LIGHT EMITTING DEVICE PROVIDED WITH THE SAME

(71) Applicant: SAMSUNG ELECTRONICS CO., LTD., Suwon-si, Gyeonggi-do (KR)

(72) Inventors: Koh Kamada, Suwon-si (KR); Tsuyoshi Ohyama, Suwon-si (KR); Eun Sung Lee, Hwaseong-si (KR); Hyunseok Choi, Anyang-si (KR); Seunghyun Lee, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 29 days.

This patent is subject to a terminal disclaimer.

(21) Appl. No.: 14/962,797

(22) Filed: Dec. 8, 2015

(65) Prior Publication Data
US 2016/0161655 A1 Jun. 9, 2016

(30) Foreign Application Priority Data
Dec. 8, 2014 (KR) .................. 10-2014-0174872
Dec. 3, 2015 (KR) .................. 10-2015-0171754

(51) Int. Cl.
*H01L 29/04* (2006.01)
*G02B 5/30* (2006.01)
(Continued)

(52) U.S. Cl.
CPC ......... *G02B 5/3083* (2013.01); *G02B 5/3016* (2013.01); *H01L 27/3232* (2013.01); *H01L 51/5281* (2013.01)

(58) Field of Classification Search
CPC .................................................. H01L 27/3232
See application file for complete search history.

(56) References Cited

U.S. PATENT DOCUMENTS 5,567,349 A 10/1996 Kelly et al.
6,339,114 B1 1/2002 Klee et al.
(Continued)

FOREIGN PATENT DOCUMENTS

CN 101106181 A 1/2008
CN 101454699 A 6/2009
(Continued)

OTHER PUBLICATIONS

Office Action Dated Oct. 8, 2016, for the corresponding Chinese Patent Application No. 201510896414.1 w/English Translation.
(Continued)

*Primary Examiner* — Samuel Gebremariam
(74) *Attorney, Agent, or Firm* — Cantor Colburn LLP

(57) ABSTRACT

An organic light emitting device includes an anti-reflection film including a polarizer and a compensation film positioned on the polarizer and including a liquid crystal layer which includes liquid crystals oriented in a direction tilting obliquely with respect to a surface of the liquid crystal layer extending in a horizontal direction in a cross sectional view, tilt angles of the liquid crystals are gradually larger from the first side to the second side, a maximum tilt angle of the liquid crystals with respect to the surface of the liquid crystal layer is from about 15° to about 80°, and in-plane retardation ($R_e$) of the liquid crystal layer for incident light of a 450 nm wavelength and a 550 nm wavelength satisfies a Relationship 1.

15 Claims, 8 Drawing Sheets

(51) Int. Cl.
*H01L 51/52* (2006.01)
*H01L 27/32* (2006.01)

(56) References Cited

U.S. PATENT DOCUMENTS

| | | |
|---|---|---|
| 7,227,602 B2 | 6/2007 | Jeon et al. |
| 7,336,857 B2 | 2/2008 | Kawahara et al. |
| 7,625,612 B2 | 12/2009 | Ohmori et al. |
| 7,852,561 B2 | 12/2010 | Chiba et al. |
| 7,947,973 B2 | 5/2011 | Song et al. |
| 8,119,026 B2 | 2/2012 | Parri et al. |
| 8,425,991 B2 | 4/2013 | Nimura et al. |
| 8,512,824 B2 | 8/2013 | Kasianova et al. |
| 8,547,512 B2 | 10/2013 | Lee |
| 8,574,689 B2 | 11/2013 | Shin et al. |
| 8,599,339 B2 | 12/2013 | Lee et al. |
| 8,687,259 B2 | 4/2014 | Adlem et al. |
| 9,159,958 B2 | 10/2015 | Jeon et al. |
| 9,442,233 B2 | 9/2016 | Murakami et al. |
| 9,500,790 B2 | 11/2016 | Fujisawa et al. |
| 9,583,543 B2 * | 2/2017 | Kamada .............. H01L 27/3232 |
| 2005/0237455 A1 | 10/2005 | Fujioka et al. |
| 2006/0221281 A1 | 10/2006 | Kobayashi |
| 2006/0232733 A1 | 10/2006 | Shibazaki |
| 2006/0246232 A1 | 11/2006 | Kubo et al. |
| 2006/0274229 A1 | 12/2006 | Ito et al. |
| 2008/0252827 A1 | 10/2008 | Hirai et al. |
| 2008/0273151 A1 | 11/2008 | Kuo et al. |
| 2009/0122237 A1 | 5/2009 | Fukagawa et al. |
| 2009/0257003 A1 | 10/2009 | Yoshihara et al. |
| 2010/0045910 A1 | 2/2010 | Bitou et al. |
| 2010/0157204 A1 | 6/2010 | Ichihashi et al. |
| 2012/0037928 A1 | 2/2012 | Shim et al. |
| 2012/0108781 A1 | 5/2012 | Adlem et al. |
| 2013/0044286 A1 | 2/2013 | Yoon et al. |
| 2013/0140587 A1 | 6/2013 | Lim et al. |
| 2013/0249378 A1 | 9/2013 | Murakami et al. |

FOREIGN PATENT DOCUMENTS

| | | |
|---|---|---|
| CN | 102842271 A | 12/2012 |
| CN | 103250077 A | 8/2013 |
| CN | 104136947 A | 11/2014 |
| EP | 1879242 A1 | 1/2008 |
| JP | 3325560 | 7/2002 |
| JP | 2004125830 A | 4/2004 |
| JP | 2004341207 A | 12/2004 |
| JP | 2005164957 A | 6/2005 |
| JP | 2006309024 | 11/2006 |
| JP | 2006337676 A | 12/2006 |
| JP | 2007206307 | 8/2007 |
| JP | 2009169086 | 7/2009 |
| JP | 2010026091 | 2/2010 |
| JP | 201084032 | 4/2010 |
| JP | 2010084032 | 4/2010 |
| JP | 4548726 | 7/2010 |
| JP | 2010151910 A | 7/2010 |
| JP | 2010522892 | 7/2010 |
| JP | 4803363 | 8/2011 |
| JP | 2011194715 | 10/2011 |
| JP | 20127160 | 1/2012 |
| JP | 2012007160 | 1/2012 |
| JP | 201235445 | 2/2012 |
| JP | 2012035445 | 2/2012 |
| JP | 2012150477 | 8/2012 |
| JP | 5079150 | 9/2012 |
| JP | 2013114141 | 6/2013 |
| JP | 5505566 | 3/2014 |
| JP | 2014186351 A | 10/2014 |
| JP | 2014224926 A | 12/2014 |
| JP | 2015161714 A | 9/2015 |
| KR | 1020040025862 | 3/2004 |
| KR | 1020050070616 | 7/2005 |
| KR | 1020050070616 A | 7/2005 |
| KR | 1020060089402 | 8/2006 |
| KR | 1020080027749 | 3/2008 |
| KR | 1020080092303 | 10/2008 |
| KR | 1020090003296 | 1/2009 |
| KR | 1020100073751 | 7/2010 |
| KR | 1020110103068 | 9/2011 |
| KR | 1020120055129 | 5/2012 |
| KR | 1020120116887 | 10/2012 |
| KR | 1020130072048 | 7/2013 |
| KR | 1020150038836 | 4/2015 |
| WO | 2007064039 A1 | 6/2007 |
| WO | 2007142037 A1 | 12/2007 |
| WO | 2013125211 A1 | 8/2013 |
| WO | 2013157888 | 10/2013 |
| WO | 2014073616 A1 | 5/2014 |
| WO | 2015122387 A1 | 8/2015 |

OTHER PUBLICATIONS

Korean Office Action dated Jan. 7, 2016, of the corresponding Korean Patent Application No. 10-2014-0174872 w/English Translation.
Japanese Office Action for Japanese Patent Application No. 2015-239173 dated Jul. 15, 2016 with English Translation.
Extended European Search Report dated Apr. 14, 2016 of the corresponding European Patent Application No. 15198492.2.
NOA of KR 10-2014-0174872 and English Translation.
US Office Action of U.S. Appl. No. 14/726,159 dated Apr. 21, 2016.
Chinese Office Action dated Apr. 5, 2017, for the corresponding Chinese Patent Application No. 201510895227.1 with English Translation.

* cited by examiner

ANTIREFLECTION FILM AND ORGANIC LIGHT EMITTING DEVICE PROVIDED WITH THE SAME

CROSS-REFERENCE TO RELATED APPLICATION

This application claims priority to Korean Patent Applications No. 10-2014-0174872 and 10-2015-0171754, filed on Dec. 8, 2014 and Dec. 3, 2015, respectively, and all the benefits accruing therefrom under 35 U.S.C. §119, the content of which in its entirety is herein incorporated by reference.

BACKGROUND

1. Field

An anti-reflection film and an organic light emitting device including the same are disclosed.

2. Description of the Related Art

Recently, as demand for lightness and thinness of a display device such as a monitor, a television, or the like, has increased, an organic light emitting device ("OLED") has drawn attention. The OLED is a self light-emitting display device, which does not need a separate backlight, and thus may realize a thin and flexible display device.

The OLED may reflect external light by a metal electrode and a metal line of the organic light emitting display panel. However, the visibility and the contrast ratio may be deteriorated by reflection of exterior light, thereby reducing display quality. In order to reduce the deterioration, a circular polarizing plate is attached to one surface of an organic light emitting display panel and thus leakage of the reflected external light to the outside may be reduced.

SUMMARY

One exemplary embodiment provides an anti-reflection film capable of improving display characteristics by decreasing viewing angle dependency without increasing a thickness.

Another exemplary embodiment provides an organic light emitting device ("OLED") including the anti-reflection film.

According to one exemplary embodiment, an anti-reflection film includes a polarizer and a compensation film positioned on the polarizer and including a liquid crystal layer having a first side and a second side facing each other, wherein the liquid crystal layer includes liquid crystals oriented in a direction tilting obliquely with respect to a surface of the liquid crystal layer extending in a horizontal direction in a cross sectional view, tilt angles of the liquid crystals are gradually larger from the first side to the second side, a maximum tilt angle of the liquid crystals with respect to the surface of the liquid crystal layer is from about 15° to about 80°, and in-plane retardation ($R_e$) of the liquid crystal layer for incident light of a 450 nm wavelength and a 550 nm wavelength satisfies a following Relationship 1:

$$0.7 \leq R_e(450 \text{ nm})/R_e(550 \text{ nm}) < 1.0 \qquad [\text{Relationship 1}]$$

wherein, in the Relationship 1,
$R_e$ (450 nm) is in-plane retardation for incident light of the 450 nm wavelength, and
$R_e$ (550 nm) is in-plane retardation for incident light of the 550 nm wavelength.

In an exemplary embodiment, the first side of the liquid crystal layer may face the polarizer.

In an exemplary embodiment, the second side of the liquid crystal layer may face the polarizer.

In an exemplary embodiment, the compensation film may further include an alignment layer contacting the liquid crystal layer.

In an exemplary embodiment, the compensation film may have in-plane retardation ($R_e$) of about 120 nm to about 160 nm for incident light of the 550 nm wavelength.

In an exemplary embodiment, in-plane retardation ($R_e$) of the liquid crystal layer for incident light of the 450 nm wavelength, the 550 nm wavelength, and a 650 nm wavelength may satisfy a following Relationship 2.

$$R_e(450 \text{ nm}) < R_e(550 \text{ nm}) \leq R_e(650 \text{ nm}) \qquad [\text{Relationship 2}]$$

In the Relationship 2,
$R_e$ (450 nm) is in-plane retardation for incident light of the 450 nm wavelength,
$R_e$ (550 nm) is in-plane retardation for incident light of the 550 nm wavelength, and
$R_e$ (650 nm) is in-plane retardation for incident light of the 650 nm wavelength.

In an exemplary embodiment, a color shift of the anti-reflection film at a viewing angle of about 60° may be less than or equal to about 7.8.

According to another exemplary embodiment, an OLED includes an organic light emitting display panel and an anti-reflection film, wherein the anti-reflection film includes a polarizer, and a compensation film positioned on the polarizer and including a liquid crystal layer having a first side and a second side facing each other, wherein the liquid crystal layer includes liquid crystals oriented in a direction tilting obliquely with respect to the surface of the liquid crystal layer extending in a horizontal direction in a cross sectional view, tilt angles of the liquid crystals are gradually larger from the first side to the second side, a maximum tilt angle of the liquid crystals with respect to the surface of the liquid crystal layer is from about 15° to about 80°, and in-plane retardation ($R_e$) of the liquid crystal layer for incident light of a 450 nm wavelength and a 550 nm wavelength satisfies Relationship 1.

In an exemplary embodiment, the compensation film may be positioned between the polarizer and the organic light emitting display panel, the first side of the liquid crystal layer may be positioned at a same side as the polarizer, and the second side of the liquid crystal layer may be positioned at a same side as the organic light emitting display panel.

In an exemplary embodiment, the compensation film may be positioned between the polarizer and the organic light emitting display panel, the first side of the liquid crystal layer may be positioned at a same side as the organic light emitting display panel, and the second side of the liquid crystal layer may be positioned at a same side as the polarizer.

In an exemplary embodiment, the compensation film may further include an alignment layer contacting the liquid crystal layer.

In an exemplary embodiment, the compensation film may have in-plane retardation ($R_e$) of about 120 nm to about 160 nm for light of a 550 nm wavelength.

In an exemplary embodiment, the in-plane retardation ($R_e$) of the liquid crystal layer for the 450 nm wavelength, the 550 nm wavelength, and the 650 nm wavelength may satisfy the Relationship 2.

In an exemplary embodiment, a color shift of the anti-reflection film at a viewing angle of about 60° may be less than or equal to about 7.8.

Since a conventionally-developed circular polarizing plate has strong viewing angle dependency, visibility may be deteriorated when viewed by an observer from the side. In order to compensate the deterioration in visibility, a compensation film may be laminated, but the lamination increases the entire thickness of the OLED and thus thinness is difficult to realize. In contrast, exemplary embodiments of an anti-reflection film improve display characteristics by decreasing viewing angle dependency without increasing the thickness of the film.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
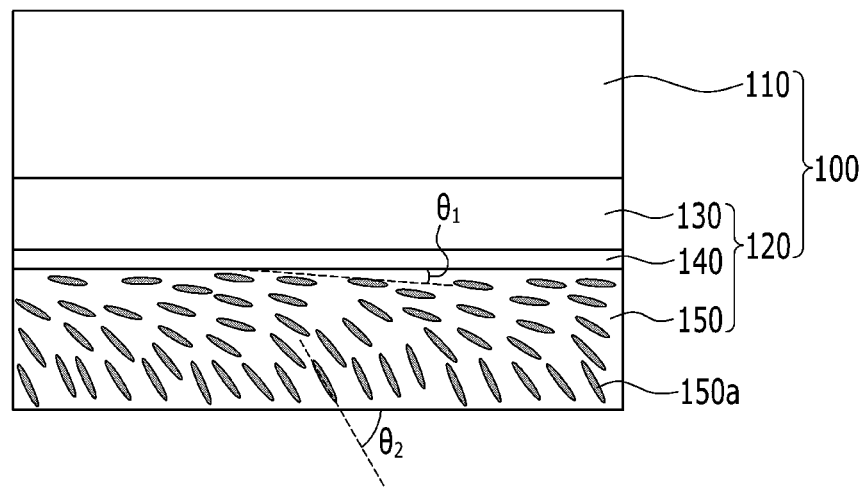
FIG. 1 is a cross-sectional view showing an exemplary embodiment of an anti-reflection film.

Exemplary embodiments of the invention will hereinafter be described in detail, and may be easily performed by those who have common knowledge in the related art. However, this disclosure may be embodied in many different forms, and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment of an anti-reflection film is described with reference to the accompanying drawings.

FIG. 1 is a cross-sectional view showing an exemplary embodiment of an anti-reflection film.

Referring to FIG. 1, an exemplary anti-reflection film 100 includes a polarizer 110 and a compensation film 120.

The polarizer 110 may be disposed at the side of the film where the light enters, and may be a linear polarizer shifting the polarization of incident light into linear polarized light.

In an exemplary embodiment, the polarizer 110 may include, for example, elongated polyvinyl alcohol ("PVA") prepared according to a method of, for example, stretching a polyvinyl alcohol film, adsorbing iodine or a dichroic dye thereto, treating the film with boric acid, and washing the same.

In an exemplary embodiment, the polarizer 110 may be, for example, a polarizing film prepared by melt-blending a polymer resin and a dichroic dye, and the polarizing film may be, for example, made by mixing a polymer resin and a dichroic dye and melting the mixture at a temperature above the melting point of the polymer resin to manufacture it in a form of a sheet.

The compensation film 120 circularly polarizes linearly polarized light passed through the polarizer 110 to generate phase retardation, and may be, for example, a λ/4 plate. The λ/4 plate may have in-plane retardation ($R_e$) of, for example, about 120 nanometers (nm) to about 160 nm for incident light of a 550 nm wavelength (hereinafter referred to as 'reference wavelength').

The compensation film 120 includes a substrate 130, an alignment layer 140, and a liquid crystal layer 150.

In an exemplary embodiment, the substrate 130 may be, for example, a glass substrate or a polymer substrate. The polymer substrate may be a substrate including, for example, polyethylene terephthalate ("PET"), PVA, polycarbonate ("PC"), triacetyl cellulose ("TAC"), a derivative thereof, or a combination thereof, but is not limited thereto. When the compensation film 120 includes another lower layer besides the substrate 130, the substrate 130 may be the lower layer. However, the invention is not limited thereto, and the substrate 130 may be omitted as needed.

The alignment layer 140 may provide a pretilt angle to the liquid crystals in the liquid crystal layer, and thus control alignment of the liquid crystals. In an exemplary embodiment, the alignment layer 140 may include, for example, polyvinyl alcohol, polyolefin, polyamic acid, polyimide, or a combination thereof. The alignment layer 140 may have improved liquid crystal aligning properties through a physical treatment such as rubbing on the surface of the alignment layer 140 or a photo-treatment such as photo-alignment.

The liquid crystal layer 150 may include a plurality of liquid crystals 150a oriented in a direction tilting obliquely with respect to the surface of the liquid crystal layer 150 and extending in a horizontal direction in a cross sectional view. Herein, "tilting obliquely" with respect to the surface of the liquid crystal layer 150 means that the liquid crystals are not vertically or horizontally aligned with the surface of the liquid crystal layer 150, but rather, each liquid crystal 150a may be tilted at an angle of greater than 0° to less than about 90° with respect to the surface of the liquid crystal layer 150.

The angle at which the liquid crystals 150a are tilted with respect to the surface of the liquid crystal layer 150 (hereinafter referred to as 'a tilt angle') may change along the thickness direction of the liquid crystal layer 150. For example, the tilt angle of the liquid crystals 150a may gradually change along the thickness direction of the liquid crystal layer 150.

In an exemplary embodiment, the liquid crystal layer 150 may be a bottom tilt structure in which a tilt angle of the liquid crystals 150a are gradually larger (i.e. gradually increase) from the top of the liquid crystal layer 150 to the bottom of the liquid crystal layer 150. For example, when the liquid crystal layer 150 has a first side contacting the alignment layer 140 and a second side contacting air, the tilt angle of the liquid crystals 150a may be gradually larger from the first side to the second side.

In an exemplary embodiment, for example, the tilt angle ($\theta_1$) of the liquid crystals 150a at the first side of the liquid crystal layer 150 may be a pretilt angle caused by the alignment layer 140. The pretilt angle, for example, may range from greater than 0° to less than or equal to about 20°. In an exemplary embodiment, the tilt angle ($\theta_1$) may be, for example, from greater than about 0° to less than or equal to about 15°, specifically, from greater than about 0° to less than or equal to about 10°, more specifically, from greater than 0° to less than or equal to about 5°, and even more specifically, from about 2° to about 5°.

The tilt angle ($\theta_2$) of the liquid crystals 150a at the second side of the liquid crystal layer 150 may be a maximum tilt angle, for example, in a range of about 15° to about 80°. In an exemplary embodiment, the maximum tilt angle may be in a range of about 30° to about 75°, specifically, in a range of about 35° to about 75°, more specifically, in a range of about 35° to about 70°, even more specifically, in a range of about 35° to about 65°, and yet even more specifically, about 40° to about 60°.

The liquid crystal layer 150 may have reverse wavelength dispersion phase delay in a shorter wavelength region than the 550 nm reference wavelength. The phase delay may be represented by in-plane retardation ($R_e$) relative to the reference wavelength, and the in-plane retardation ($R_e$) may be represented by the equation $R_e=(n_x-n_y)d$. Herein, $n_x$ is a refractive index in a direction having the highest refractive index in a plane of the liquid crystal layer 150 (hereinafter referred to as "a slow axis"), $n_y$ is a refractive index in a direction having the lowest refractive index in a plane of the liquid crystal layer 150 (hereinafter referred to as "a fast axis"), and d is a thickness of the liquid crystal layer 150.

The retardation to light of short wavelengths may be represented by a ratio of in-plane retardation ($R_e$) for a 450 nm wavelength to in-plane retardation for a 550 nm wavelength. For example, the retardation to light of short wavelengths by the liquid crystal layer 150 may satisfy the following Relationship 1:

$$0.7 \le R_e(450\ nm)/R_e(550\ nm) < 1.0 \qquad \text{[Relationship 1]}$$

In Relationship 1, $R_e$ (450 nm) is the in-plane retardation for incident light of the 450 nm wavelength, and $R_e$ (550 nm) is the in-plane retardation for incident light of the 550 nm wavelength.

Specifically, the retardation to light of short wavelengths by the liquid crystal layer 150 may satisfy the following Relationship 1a:

$$0.72 \le R_e(450\ nm)/R_e(550\ nm) \le 0.92. \qquad \text{[Relationship 1a]}$$

More specifically, the retardation to light of short wavelengths by the liquid crystal layer 150 may satisfy the following Relationship 1b:

$$0.75 \le R_e(450\ nm)/R_e(550\ nm) \le 0.90. \qquad \text{[Relationship 1b]}$$

Even more specifically, the retardation to light of short wavelengths by the liquid crystal layer 150 may satisfy the following Relationship 1c:

$$0.80 \le R_e(450\ nm)/R_e(550\ nm) \le 0.85. \qquad \text{[Relationship 1c]}$$

The liquid crystal layer 150 may have reverse wavelength dispersion phase delay in a longer wavelength region than the 550 nm wavelength as well as reverse wavelength dispersion phase delay in a shorter wavelength region than the 550 nm wavelength.

The reverse wavelength dispersion phase delay has higher retardation of light having long wavelengths than retardation of light having short wavelengths, and in-plane retardation ($R_e$) by the liquid crystal layer 150 for a 450 nm wavelength, a 550 nm wavelength, and a 650 nm wavelength may, for example, satisfy the following Relationship 2.

$$R_e(450\ nm) < R_e(550\ nm) \leq R_e(650\ nm) \quad \text{[Relationship 2]}$$

In Relationship 2, $R_e$ (450 nm) is in-plane retardation for incident light of the 450 nm wavelength, $R_e$ (550 nm) is in-plane retardation for incident light of the 550 nm wavelength, and $R_e$ (650 nm) is the in-plane retardation for incident light of the 650 nm wavelength.

The liquid crystal layer 150 includes a plurality of liquid crystals 150a oriented in an obliquely-tilted direction, and the tilt angle of the liquid crystals 150a may be changed along the thickness direction of the liquid crystal layer 150. Accordingly circularly-polarized light effect is equally realized in all directions and external light is effectively prevented from reflection at the sides, thereby improving side visibility.

In an exemplary embodiment, the liquid crystals 150a may have a rod shape extended in one direction, and may include, for example, a monomer, an oligomer, and/or a polymer. In an exemplary embodiment, the liquid crystal 150a may have positive or negative birefringence values ($\Delta n$).

In an exemplary embodiment, the liquid crystals 150a may be reactive mesogen liquid crystals, and may include, for example, at least one mesogen moiety and at least one polymerizable functional group. In an exemplary embodiment, the reactive mesogen liquid crystals may include at least one of, for example, a rod-shaped aromatic derivative including at least one reactive cross-linking group, propylene glycol 1-methyl, propylene glycol 2-acetate, and a compound represented by $P^1$-$A^1$-$(Z^1$-$A^2)_n$-$P^2$ (wherein $P^1$ and $P^2$ are independently a polymerizable functional group such as acrylate, methacrylate, acryloyl, vinyl, vinyloxy, or epoxy, $A^1$ and $A^2$ are independently 1,4-phenylene group, or naphthalene-2,6-diyl group, $Z^1$ is a single bond, —COO—, or —OCO—, and n is 0, 1, or 2), but is not limited thereto.

In an exemplary embodiment, the liquid crystals 150a may be a thermosetting liquid crystal or a photocurable liquid crystal, and more specifically, the liquid crystal 150a may be a photocurable liquid crystal. In an exemplary embodiment, when the liquid crystal 150a is a photocurable liquid crystal, the light used for photocuring the photocurable liquid crystal may be ultraviolet ("UV") light having a wavelength from about 250 nm to about 400 nm.

In an exemplary embodiment, the liquid crystals 150a may be cross-linkable liquid crystals. For example, the cross-linkage liquid crystal may be a compound represented by one of the following Chemical Formulas 1A to 1F.

[Chemical Formula 1A]

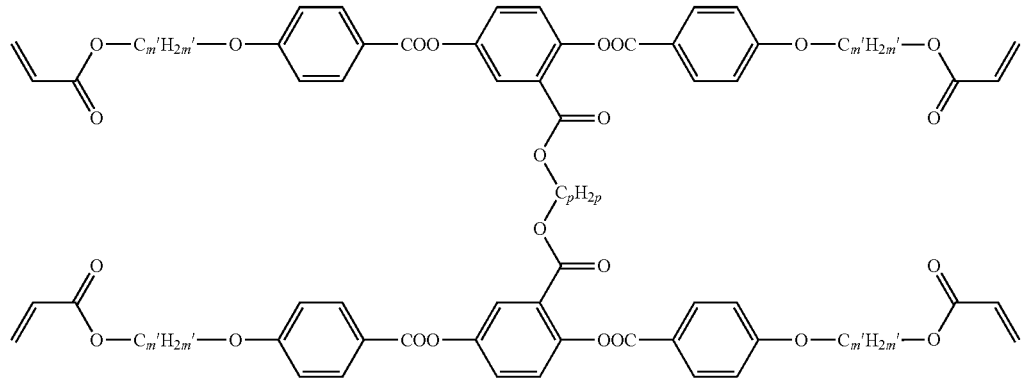

[Chemical Formula 1B]

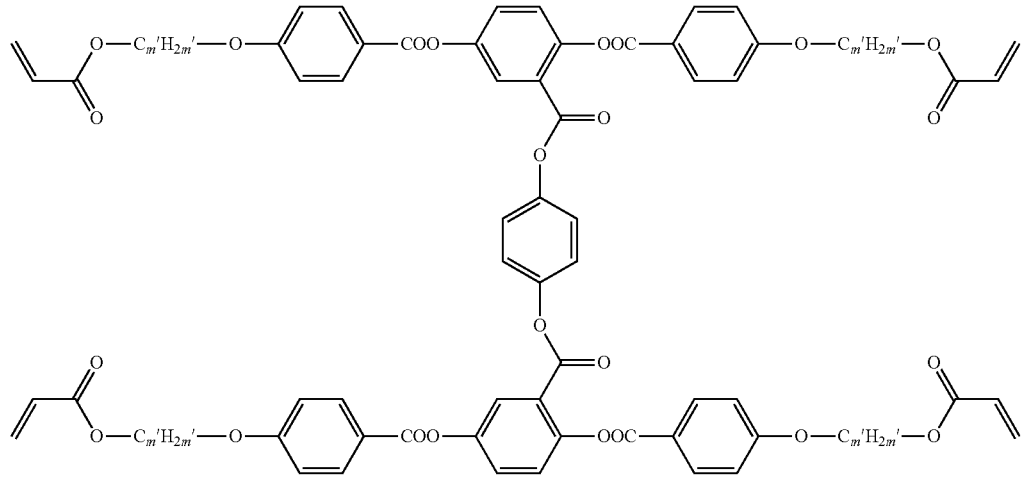

[Chemical Formula 1C]
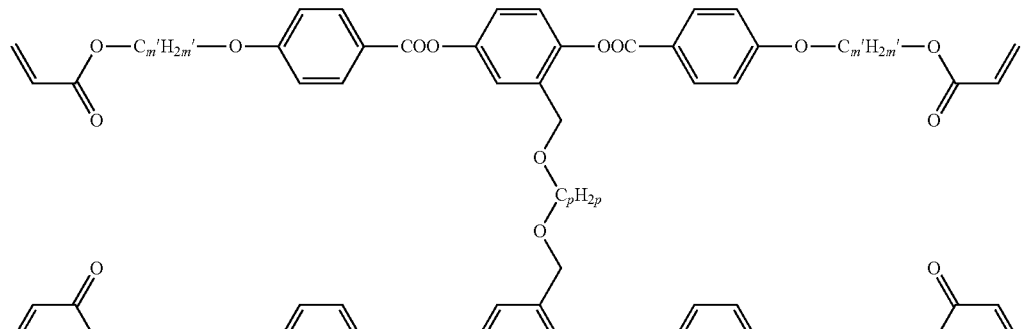
[Chemical Formula 1D]
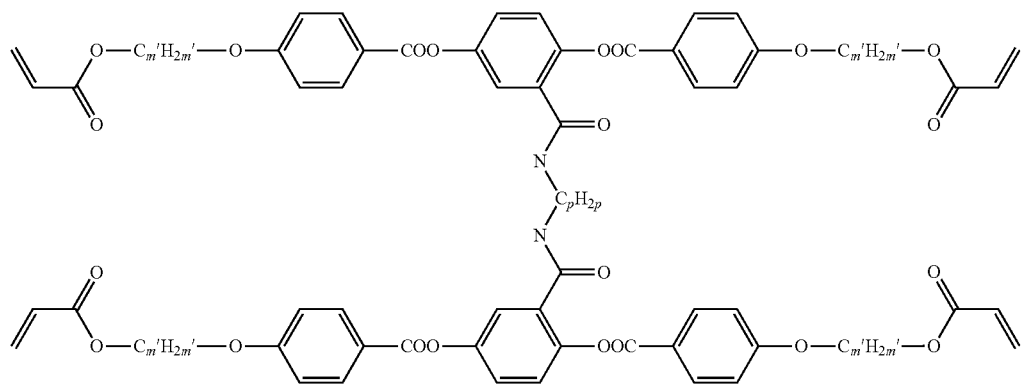
[Chemical Formula 1E]
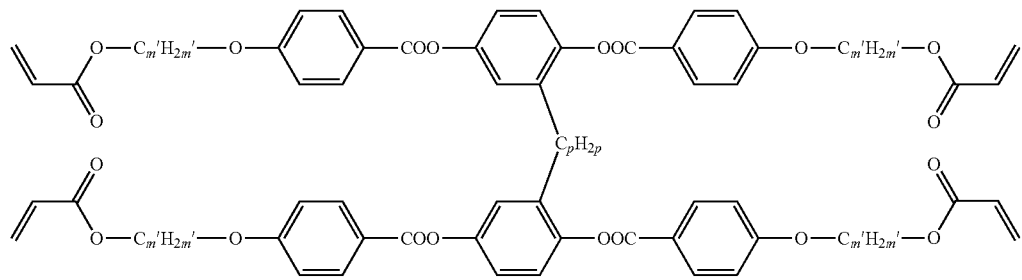
[Chemical Formula 1F]
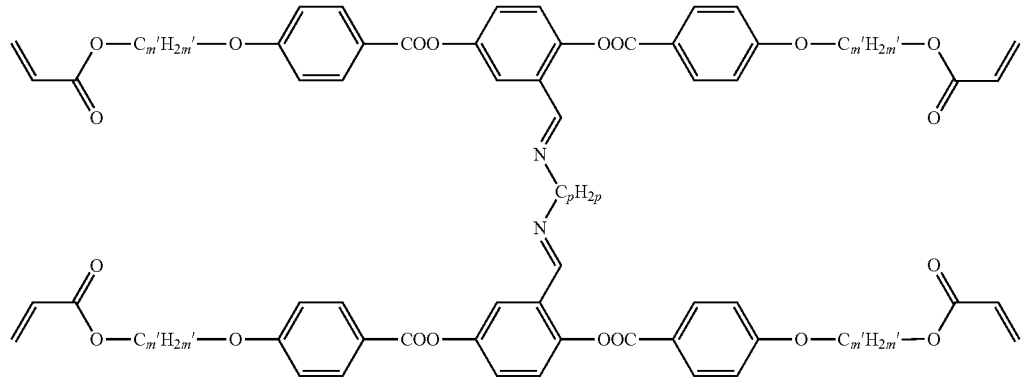
In Chemical Formulae 1A to 1F, each m' is independently an integer of 4 to 12, and each p is independently an integer of 2 to 12.
In an exemplary embodiment, the liquid crystals 150a may include a compound represented by the following Chemical Formula 2A.

[Chemical Formula 2A]
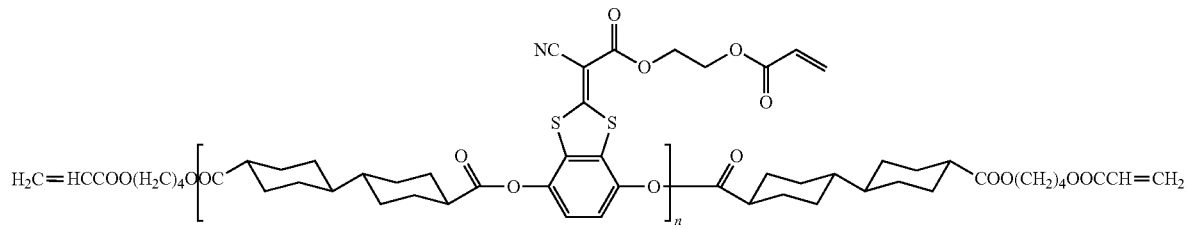
In Chemical Formula 2A, n is an integer of 2 to 10.
In an exemplary embodiment, the liquid crystals 150a may include a compound represented by one of the following Chemical Formulas 3A to 3E.
[Chemical Formula 3A]
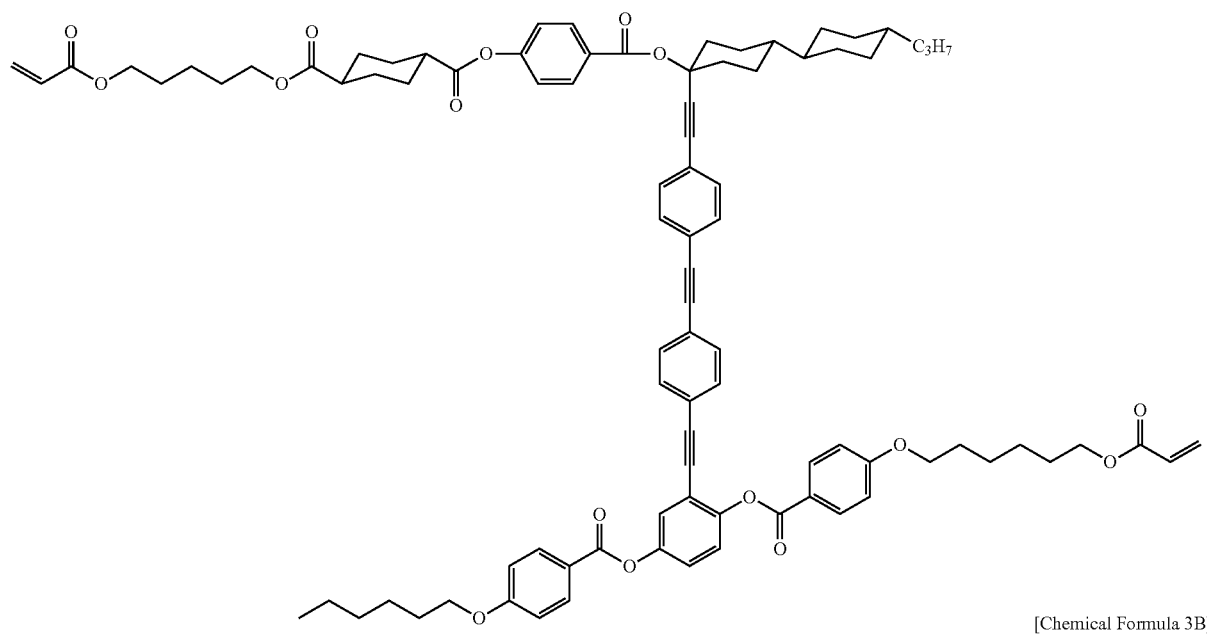
[Chemical Formula 3B]
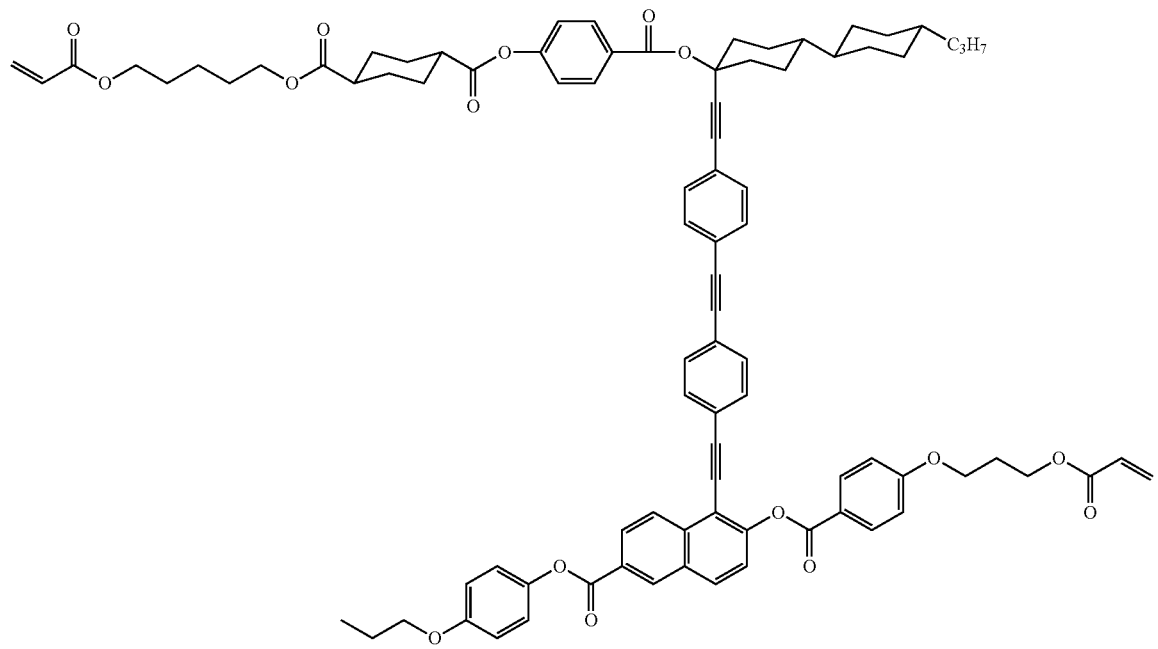

[Chemical Formula 3C]
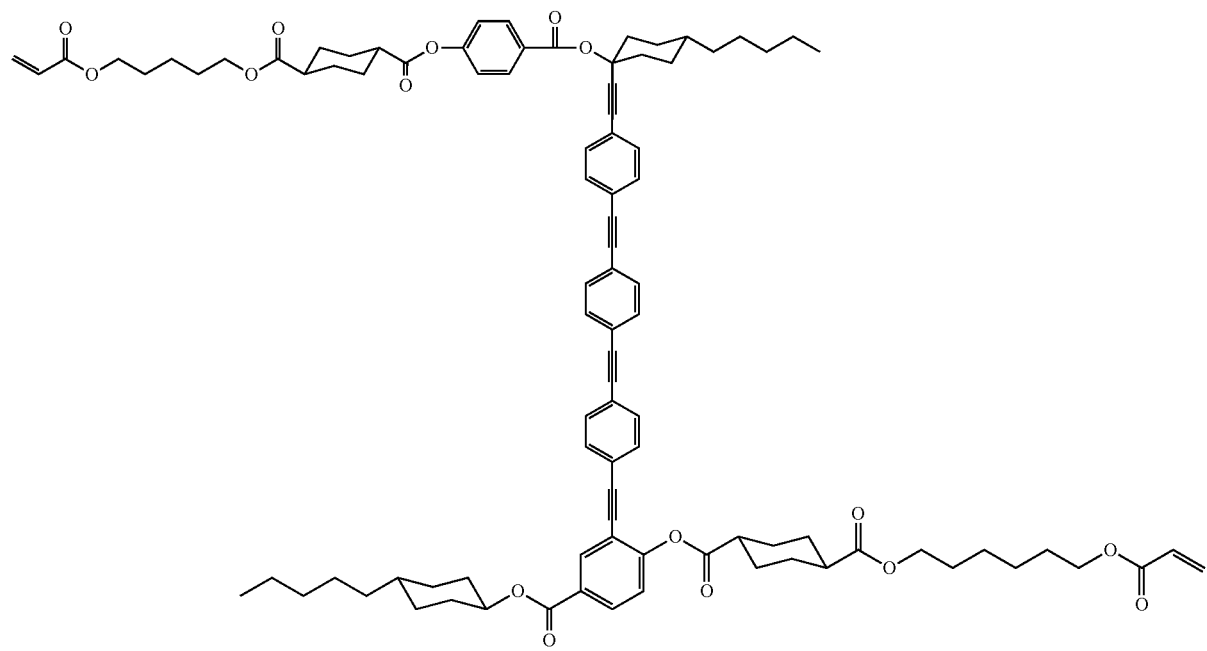
[Chemical Formula 3D]
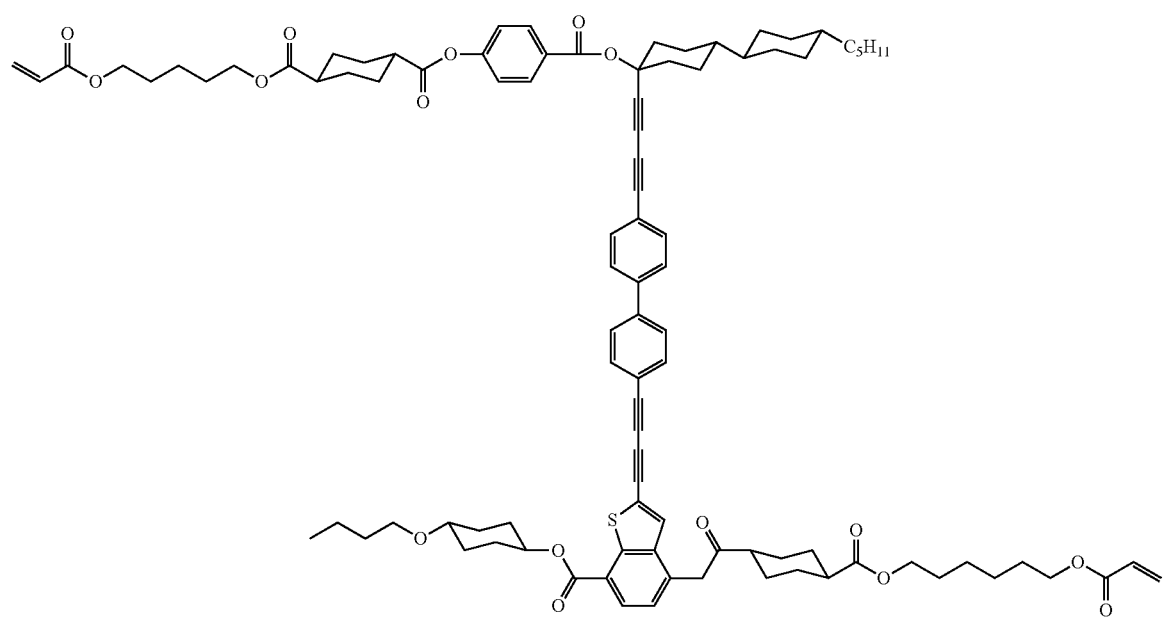

[Chemical Formula 3E]
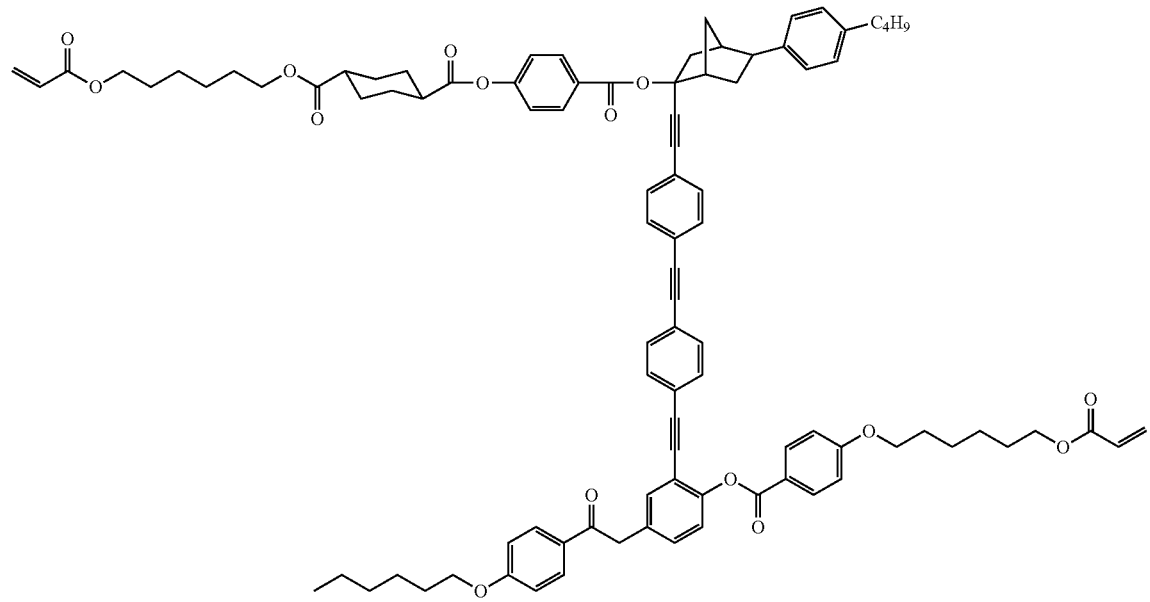
In an exemplary embodiment, the liquid crystals 150*a* may include a compound represented by the following Chemical Formulas 4A or 4B.
[Chemical Formula 4A]
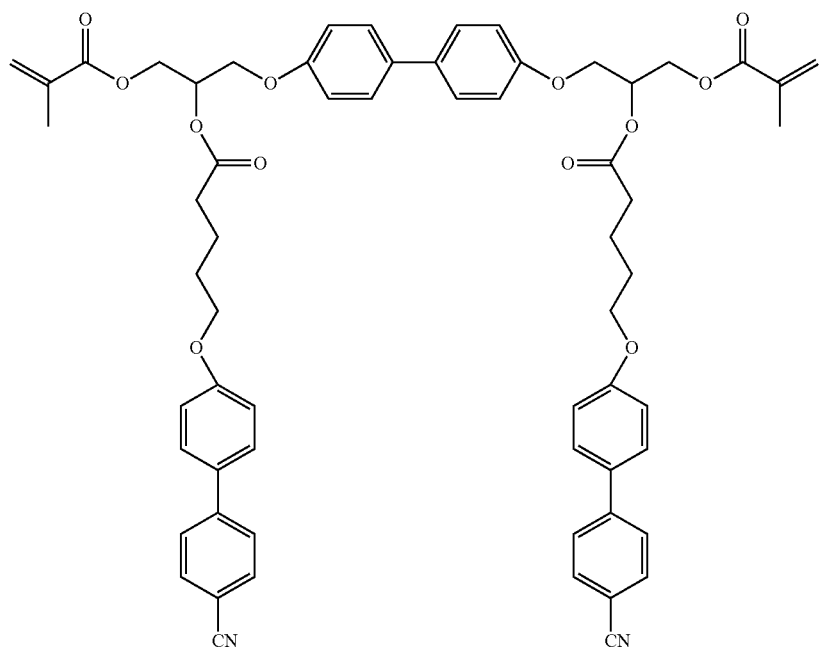

-continued

[Chemical Formula 4B]

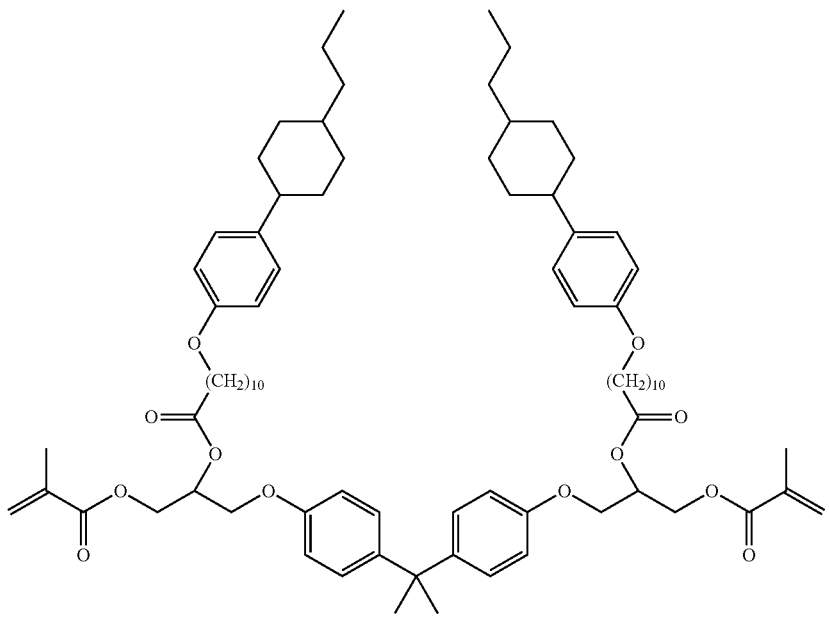

The liquid crystal layer 150 may include one or more kinds of liquid crystals 150a.

In an exemplary embodiment, the liquid crystal layer 150 may include a composition including the liquid crystals 150a, and the composition may further include various additives such as a reaction initiator, a surfactant, a dissolution assistant and/or a dispersing agent, and a solvent, in addition to the liquid crystals 150a. In an exemplary embodiment, the composition may be applied through a solution process, for example, spin coating, slit coating, bar coating, and/or inkjet coating, and the thickness of the liquid crystal layer 150 may be adjusted in consideration of a refractive index and the like.

In an exemplary embodiment, an adhesion layer (not shown) may be further disposed between the polarizer 110 and the compensation film 120. In an exemplary embodiment, the adhesion layer is used to effectively attach the polarizer 110 to the compensation film 120, and may include, for example, a pressure sensitive adhesive.

The anti-reflection film 100 may further include a protective layer (not shown) on the polarizer 110. In an exemplary embodiment, the protective layer may be provided for further reinforcing the functionality or improving the durability of the anti-reflection film 100, or for reducing reflection or glare. The protective layer may include a triacetyl cellulose ("TAC") film, but is not limited thereto.

The anti-reflection film 100 may further include a correction layer (not shown) positioned on the compensation film 120. In an exemplary embodiment, the correction layer may be, for example, a color shift resistant layer, but is not limited thereto.

The anti-reflection film 100 may further include a light blocking layer (not shown) extended along the edge of the anti-reflection film 100. The light-blocking layer may further extend along the entire circumference of the anti-reflection film 100. In an exemplary embodiment, the light-blocking layer may include an opaque material, for example, a black material. In an exemplary embodiment, the light-blocking layer may include a black ink.

In an exemplary embodiment, the anti-reflection film 100 may be stacked with the polarizer 110 positioned on the compensation film 120, and may be formed by a roll-to-roll, a transfer and/or a coating method, but is not limited thereto.

Figure 2:
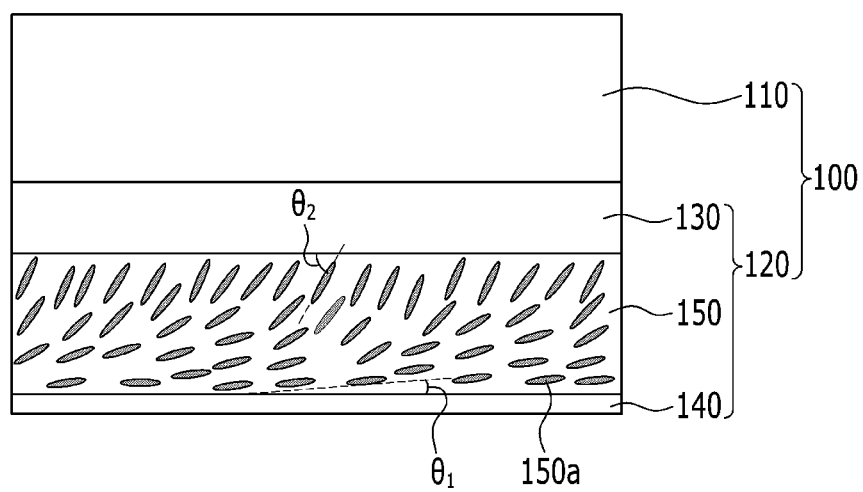
FIG. 2 is a cross-sectional view showing another exemplary embodiment of an anti-reflection film.

FIG. 2 is a cross-sectional view showing another exemplary embodiment of an anti-reflection film.

Referring to FIG. 2, an exemplary anti-reflection film 100 includes a polarizer 110 and a compensation film 120 including a substrate 130, an alignment layer 140, and liquid crystal layer 150.

The exemplary anti-reflection film illustrated in FIG. 2 has a top tilt structure in which a tilt angle of the liquid crystals 150a are gradually larger from the bottom of the liquid crystal layer 150 to the top of the liquid crystal layer 150, thereby differing from the anti-reflection film illustrated in FIG. 1. For example, when the liquid crystal layer 150 has a first side contacting the alignment layer 140 and a second side positioned on the same side as the polarizer 110, the tilt angle of the liquid crystals 150a may become gradually larger from the first side to the second side. In an exemplary embodiment, for example, the tilt angle ($\theta_1$) of the liquid crystals 150a may be a pretilt angle caused by the alignment layer 140. The tile angle ($\theta_1$) may be from greater than about 0° to less than or equal to about 20°. In an exemplary embodiment, the tilt angle ($\theta_1$) may be, for example, from greater than about 0° to less than or equal to about 15°, specifically, from greater than about 0° to less than or equal to about 10°, more specifically, from greater than about 0° to less than or equal to about 5°, and even more specifically, in a range of about 2° to about 5°.

The tilt angle ($\theta_2$) of the liquid crystals 150a at the second side the liquid crystal layer 150 may be a maximum tilt angle. The maximum tilt angle may be, for example, in a range of about 15° to about 80°. In an exemplary embodiment, the maximum tilt angle may be, specifically, in a range of about 30° to about 75°, more specifically, in a range of about 35° to about 75°, even more specifically, in a range of about 35° to about 70°, yet even more specifically, in a range of about 35° to about 65°, and still yet even more specifically, about 40° to about 60°.

Figure 3:
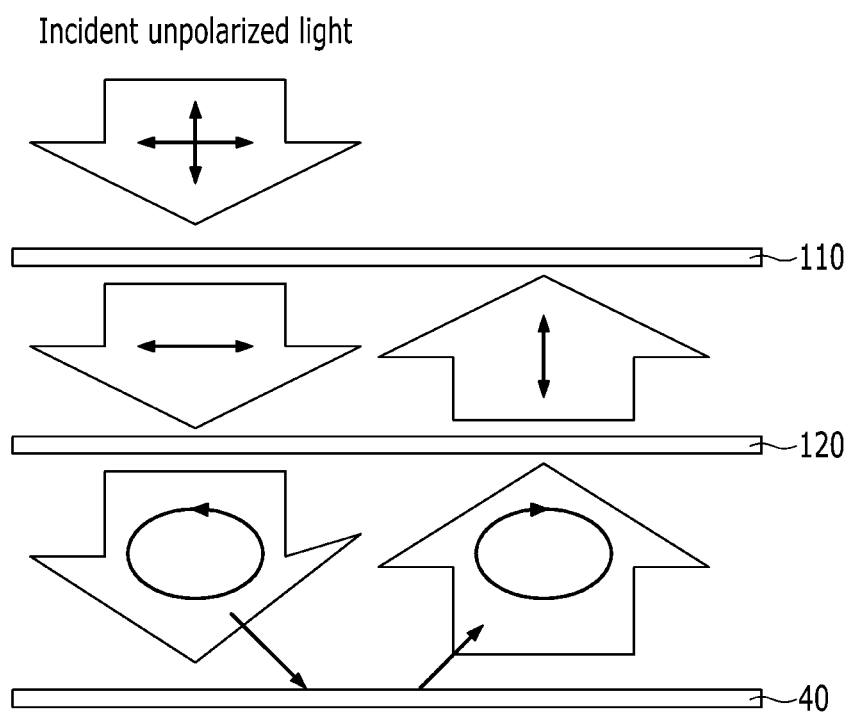
FIG. 3 is a schematic view showing one exemplary embodiment of an external light anti-reflection principle of an exemplary anti-reflection film.

FIG. 3 is a schematic view showing the external light anti-reflection principle of an exemplary embodiment of an anti-reflection film.

Referring to FIG. 3, the incident unpolarized light (hereinafter also referred to as 'external light') having entered from the outside is passed through the polarizer 110. Only a first polarized perpendicular component, which is one polarized perpendicular component of two polarized perpendicular components, is transmitted, and the polarized light is shifted into circularly polarized light by passing through the compensation film 120. The circularly polarized light is reflected by a display panel 40 (including a substrate, an electrode, and so on), and changes the circular polarization direction, and the circularly polarized light is then passed through the compensation film 120 again, where only a second polarized perpendicular component, which is the other polarized perpendicular component of the two polarized perpendicular components, may be transmitted. Since the second polarized perpendicular component is not passed through the polarizer 110, and light does not exit to the outside, effects of preventing external light reflection may be provided.

Figure 4:
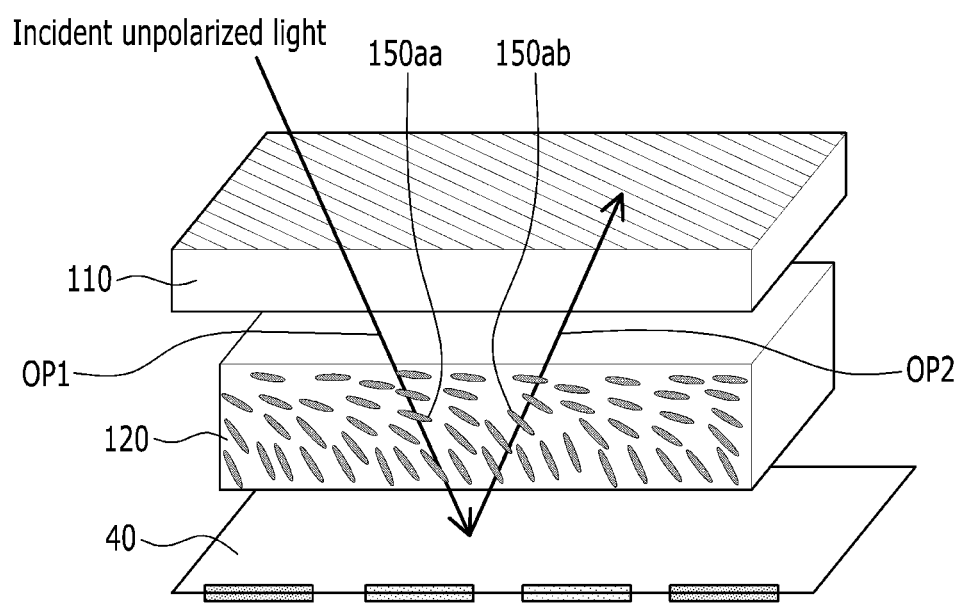
FIG. 4 is a schematic view showing an exemplary embodiment of a viewing angle improvement principle of an anti-reflection film.

FIG. 4 is a schematic view showing a viewing angle improvement principle of an exemplary embodiment of an anti-reflection film.

Referring to FIG. 4, external light passes through a first optical path OP1 in which the light passes through the compensation film 120, reaches the display panel 40, and travels through a second optical path OP2 in which the light is reflected from the display panel 40 and repassed through the compensation film 120. The light has a polarization direction that is changed through the first and second optical paths OP1 and OP2 and does not pass through the polarizer 110, showing an external light anti-reflection effect.

Herein, the first and second optical paths OP1 and OP2 may substantially form a reverted image as a reference of the display panel 40. Accordingly, the compensation film 120 includes liquid crystals that are obliquely tilted and aligned in one direction, but when external light sequentially passes the first optical path OP1 and the second optical path OP2 having opposite directions from each other, a phase difference may be adjusted by summing the oblique alignment of liquid crystals 150aa in the first optical path OP1 and the oblique alignment of liquid crystals 150ab in the second optical path OP2. Accordingly, an anti-reflection effect may be substantially equivalent in all directions, and a color shift due to a reflection of external light at the side and at the front may be effectively prevented, thereby improving side visibility.

The side visibility may be expressed as reflectance and a color shift observed at the side. In an exemplary embodiment, the reflectance of the anti-reflection film at a viewing angle of about 60° may be less than or equal to about 1.5 percent (%), specifically, less than or equal to about 1.45%, more specifically, less than or equal to about 1.2%, and even more specifically, less than or equal to about 1.0%. In an exemplary embodiment, the color shift of the anti-reflection film at a viewing angle of about 60° may be less than or equal to about 7.8, specifically, less than or equal to about 7.0, more specifically, less than or equal to about 6.9, even more specifically, less than or equal to about 6.5, yet even more specifically, less than or equal to about 6.0, and still yet even more specifically, less than or equal to about 5.0.

In FIG. 4, the anti-reflection film 100 of FIG. 1 may be explained as one exemplary embodiment, however, the anti-reflection film 100 of FIG. 2 may also be explained in the same way as the anti-reflection film 100 of FIG. 1.

The anti-reflection film 100 may be applied to an organic light emitting device ("OLED").

Hereinafter, an exemplary embodiment of an OLED is described referring to the drawings.

Figure 5:
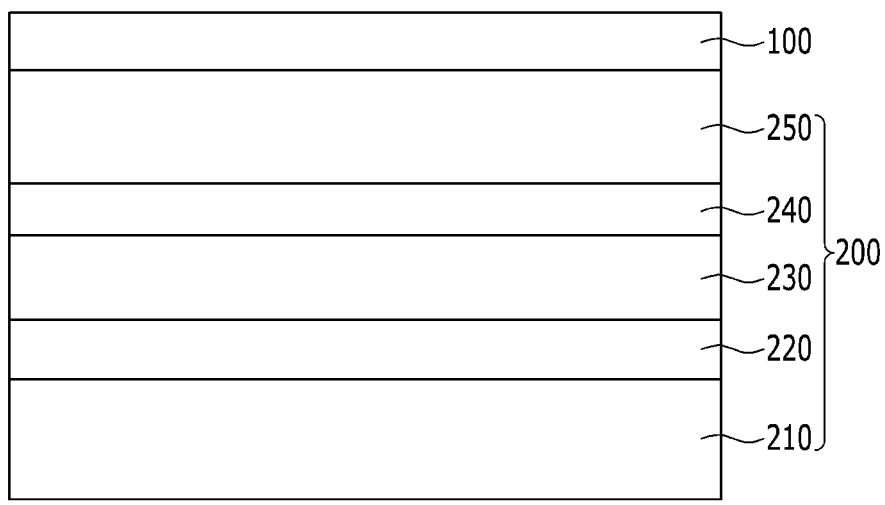
FIG. 5 is a cross-sectional view schematically showing an exemplary embodiment of an organic light emitting device.

FIG. 5 is a cross-sectional view schematically showing an OLED according to one exemplary embodiment.

Referring to FIG. 5, the exemplary OLED includes an organic light emitting display panel 200 and an anti-reflection film 100 positioned on the organic light emitting display panel 200.

The organic light emitting display panel 200 includes a base substrate 210, a lower electrode 220, an organic emission layer 230, an upper electrode 240, and an encapsulation substrate 250.

In an exemplary embodiment, the base substrate 210 may include glass or plastic.

One of the lower electrode 220 and the upper electrode 240 may be an anode, and the other may be a cathode. The anode is an electrode into which holes are injected and may include a conductive material having a high work function. The cathode is an electrode into which electrons are injected and may include a conductive material having a low work function. In an exemplary embodiment, at least one of the lower electrode 220 and the upper electrode 240 may include a transparent conductive material through which emitted light exits to the outside. The transparent conductive material may be, for example, indium tin oxide ("ITO") or indium zinc oxide ("IZO").

The organic emission layer 230 includes an organic material which may emit light when a voltage is applied to the lower electrode 220 and the upper electrode 240.

An auxiliary layer (not shown) may be further provided between the lower electrode 220 and the organic emission layer 230 and between the upper electrode 240 and the organic emission layer 230. In an exemplary embodiment, the auxiliary layer may include a hole transporting layer, a hole injecting layer, an electron injecting layer, and an electron transporting layer in order to balance electrons and holes, but is not limited thereto.

In an exemplary embodiment, the encapsulation substrate 250 may include glass, metal, or a polymer, and may seal the lower electrode 220, the organic emission layer 230, and the upper electrode 240 to prevent moisture and/or oxygen inflow from the outside.

The anti-reflection film 100 may be disposed at the side of the OLED emitting light. In an exemplary embodiment, in the case of a bottom emission structure emitting light at the side of the base substrate 210, the anti-reflection film 100 may be disposed on the exterior-facing side of the base substrate 210. In another exemplary embodiment, in the case of a top emission structure emitting light at the side of the encapsulation substrate 250, the anti-reflection film 100 may be disposed on the exterior-facing side of the encapsulation substrate 250.

The anti-reflection film 100 may prevent external light from being reflected by a metal such as an electrode of the organic light emitting display panel 200, and from emitting light from outside of the OLED, thus improving display characteristics of the OLED.

In addition, the anti-reflection film 100 may not only show a substantially equivalent anti-reflection effect in all directions, but may also effectively prevent a color shift due to reflection of external light at the side as well as in the front, and thus improve side visibility.

Hereinafter, the invention is illustrated in more detail with reference to examples. However, these examples are exemplary, and the invention is not limited thereto.

Simulation Evaluation

Example 1

A simulation evaluation (LCD Master (Shintech Inc.)) is performed by simulation-setting of a structure formed by sequentially disposing a polarizer, a compensation film ($R_e$=138 nm) including a liquid crystal layer, and a reflector. Herein, the liquid crystal layer of the compensation film has a bottom tilt structure (see FIG. 1) in which a tilt angle of the liquid crystals is larger from the top to the bottom. The minimum tilt angle (an upper tilt angle) is about 3° and the maximum tilt angle (a lower tilt angle) is about 37°, between which the tilt angle gradually changes. The wavelength dispersion (WD) of the liquid crystal layer ($R_e$ (450 nm)/$R_e$ (550 nm)) is 0.82. The angle of an axis of the polarizer is set at about 90° and the angle of an axis of the compensation film is set at about 45°.

Example 2

A simulation condition is set according to the same method as Example 1, except the maximum tilt angle (the lower tilt angle) of the liquid crystals in the liquid crystal layer of the compensation film ($R_e$=138 nm) is set at about 45°.

Example 3

A simulation condition is set according to the same method as Example 1, except the maximum tilt angle (the lower tilt angle) of liquid crystals in the liquid crystal layer of the compensation film ($R_e$=138 nm) is set at at about 65°.

Example 4

A simulation condition is set according to the same method as Example 1, except the liquid crystal layer of the compensation film has a top tilt structure (see FIG. 2) in which the tilt angle of the liquid crystals is larger from bottom to top. The maximum tilt angle (the upper tilt angle) of liquid crystals in the liquid crystal layer of the compensation film ($R_e$=138 nm) is set at about 65°.

Example 5

A simulation condition is set according to the same method as Example 1, except the maximum tilt angle (the lower tilt angle) of liquid crystals in the liquid crystal layer of the compensation film ($R_e$=138 nm) is set at about 75°.

Example 6

A simulation condition is set according to the same method as Example 1, except the maximum tilt angle (the lower tilt angle) of liquid crystals in the liquid crystal layer of the compensation film ($R_e$=138 nm) is set at about 30°.

Example 7

A simulation condition is set according to the same method as Example 1, except the liquid crystal layer of the compensation film has a top tilt structure (see FIG. 2) in which the tilt angle of the liquid crystals is larger from bottom to top. The maximum tilt angle (the upper tilt angle) of the liquid crystals in the liquid crystal layer of the compensation film ($R_e$=138 nm) is set at about 37°.

Example 8

A simulation condition is set according to the same method as Example 1, except the liquid crystal layer of the compensation film has a top tilt structure (see FIG. 2) in which a tilt angle of the liquid crystals is larger from bottom to top. The maximum tilt angle (the upper tilt angle) of the liquid crystals in the liquid crystal layer of the compensation film ($R_e$=138 nm) is set at about 45°.

Example 9

A simulation condition is set according to the same method as Example 1, except the liquid crystal layer of the compensation film has a top tilt structure (see FIG. 2) in which a tilt angle of the liquid crystals is larger from bottom to top and the maximum tilt angle (the upper tilt angle) of the liquid crystals in the liquid crystal layer of the compensation film ($R_e$=138 nm) is set at about 78°.

Example 10

A simulation condition is set according to the same method as Example 1, except the liquid crystal layer of the compensation film has a top tilt structure (see FIG. 2) in which the tilt angle of the liquid crystals is larger from bottom to top and the maximum tilt angle (the upper tilt angle) of the liquid crystals in the liquid crystal layer of the compensation film ($R_e$=138 nm) is set at about 18°.

Example 11

A simulation condition is set according to the same method as Example 1, except the liquid crystal layer of the compensation film has a top tilt structure (FIG. 2) in which a tilt angle of the liquid crystals is larger from bottom to top, the maximum tilt angle (the upper tilt angle) of the liquid crystals in the liquid crystal layer of the compensation film ($R_e$=138 nm) is set at about 45°, and the wavelength dispersion (WD) of the liquid crystal layer ($R_e$ (450 nm)/$R_e$ (550 nm)) is set at 0.90.

Example 12

A simulation condition is set according to the same method as Example 1, except the liquid crystal layer of the compensation film has a top tilt structure (FIG. 2) in which the tilt angle of the liquid crystals is larger from bottom to top, the maximum tilt angle (the upper tilt angle) of the liquid crystals in the liquid crystal layer of the compensation film ($R_e$=140 nm) is set at about 45°, and the wavelength dispersion (WD) of the liquid crystal layer ($R_e$ (450 nm)/$R_e$ (550 nm)) is set at 0.75.

Comparative Example 1

A simulation condition is set according to the same method as Example 1, except that the liquid crystal layer of the compensation film ($R_e$=138 nm) includes a plurality of liquid crystals each having a tilt angle of about 0° (plate A).

Comparative Example 2

A simulation condition is set according to the same method as Example 1, except that the liquid crystal layer of the compensation film ($R_e$=138 nm) includes a plurality of liquid crystals each having a tilt angle of about 0° (plate A) and the wavelength dispersion (WD) of the liquid crystal layer ($R_e$ (450 nm)/$R_e$ (550 nm)) is 0.90.

Comparative Example 3

A simulation condition is set according to the same method as Example 1, except that the liquid crystal layer of the compensation film ($R_e$=140 nm) includes a plurality of liquid crystals each having a tilt angle of about 0° (plate A) and the wavelength dispersion (WD) of the liquid crystal layer ($R_e$ (450 nm)/$R_e$ (550 nm)) is 0.75.

Comparative Example 4

A simulation condition is set according to the same method as Example 1, except the maximum tilt angle (the lower tilt angle) of the liquid crystals in the liquid crystal layer of the compensation film ($R_e$=138 nm) is set at about 45°, and the wavelength dispersion (WD) of the liquid crystal layer ($R_e$ (450 nm)/$R_e$ (550 nm)) is set at 1.1.

Comparative Example 5

A simulation condition is set according to the same method as Example 1, except the liquid crystal layer of the compensation film has a top tilt structure (FIG. 2) in which a tilt angle the liquid crystals is larger from bottom to top, the maximum tilt angle (the upper tilt angle) of a liquid crystal in the liquid crystal layer of the compensation film ($R_e$=138 nm) is set at about 45°, and the wavelength dispersion (WD) of the liquid crystal layer ($R_e$ (450 nm)/$R_e$ (550 nm)) is set at 1.1.

Comparative Example 6

A simulation condition is set according to the same method as Example 1, except the maximum tilt angle (the lower tilt angle) of the liquid crystals in the liquid crystal layer of the compensation film ($R_e$=138 nm) is set at about 45°, and the wavelength dispersion (WD) of the liquid crystal layer ($R_e$ (450 nm)/$R_e$ (550 nm)) is set at 0.65.

Comparative Example 7

A simulation condition is set according to the same method as Example 1, except the liquid crystal layer of the compensation film has a top tilt structure (see FIG. 2) in which a tilt angle of the liquid crystals is larger from bottom to top, the maximum tilt angle (the upper tilt angle) of the liquid crystals in the liquid crystal layer of the compensation film ($R_e$=138 nm) is set at about 13°.

Comparative Example 8

A simulation condition is set according to the same method as Example 1, except the liquid crystal layer of the compensation film has a top tilt structure (FIG. 2) in which a tilt angle of the liquid crystals becomes larger from bottom to top, and the maximum tilt angle (the upper tilt angle) of a liquid crystal in the liquid crystal layer of the compensation film ($R_e$=138 nm) is set at about 83°.

Comparative Example 9

A simulation condition is set according to the same method as Example 1, except for the maximum tilt angle (the lower tilt angle) of the liquid crystals in the liquid crystal layer of the compensation film ($R_e$=138 nm) is set at about 90°.

Comparative Example 10

A simulation condition is set according to the same method as Example 1, except the liquid crystal layer of the compensation film has a top tilt structure (see FIG. 2) in which a tilt angle of the liquid crystals is larger from bottom to top, and the maximum tilt angle (the upper tilt angle) of the liquid crystals in the liquid crystal layer of the compensation film ($R_e$=138 nm) is set at about 90°.

Evaluation
<Evaluation 1>

The reflectance and color shift of each anti-reflection film according to Examples 1 to 12 and Comparative Examples 1 to 10 are evaluated at the front and the side.

The reflectance and color shift are evaluated through simulation by using the commercially available software LCD Master (Shintech Inc.).

Figure 6:
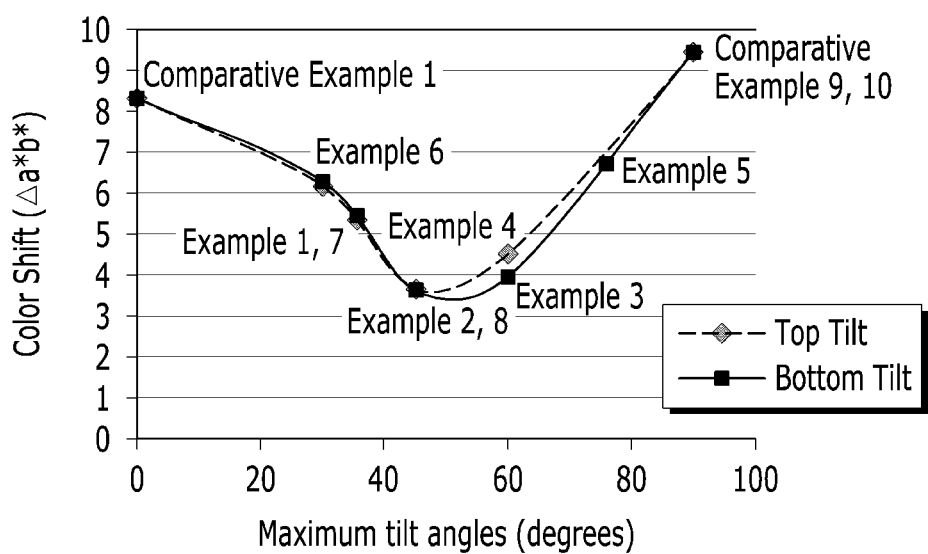
FIG. 6 is a graph showing a relationship between maximum tilt angles (degrees) of liquid crystals and color shifts at a 60° viewing angle of the anti-reflection films according to Examples 1 to 8 and Comparative Examples 1, 9, and 10.
Figure 7:
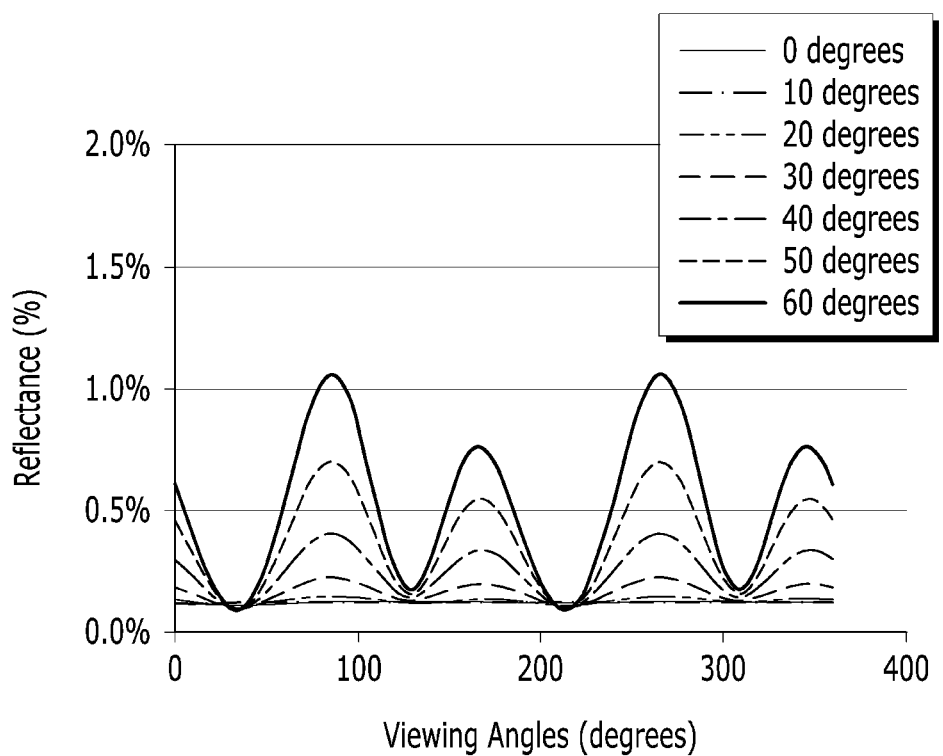
FIG. 7 is a graph showing reflectance (percentage, %) depending on a viewing angle (degrees) across all directions of the anti-reflection film according to Example 2.
Figure 8:
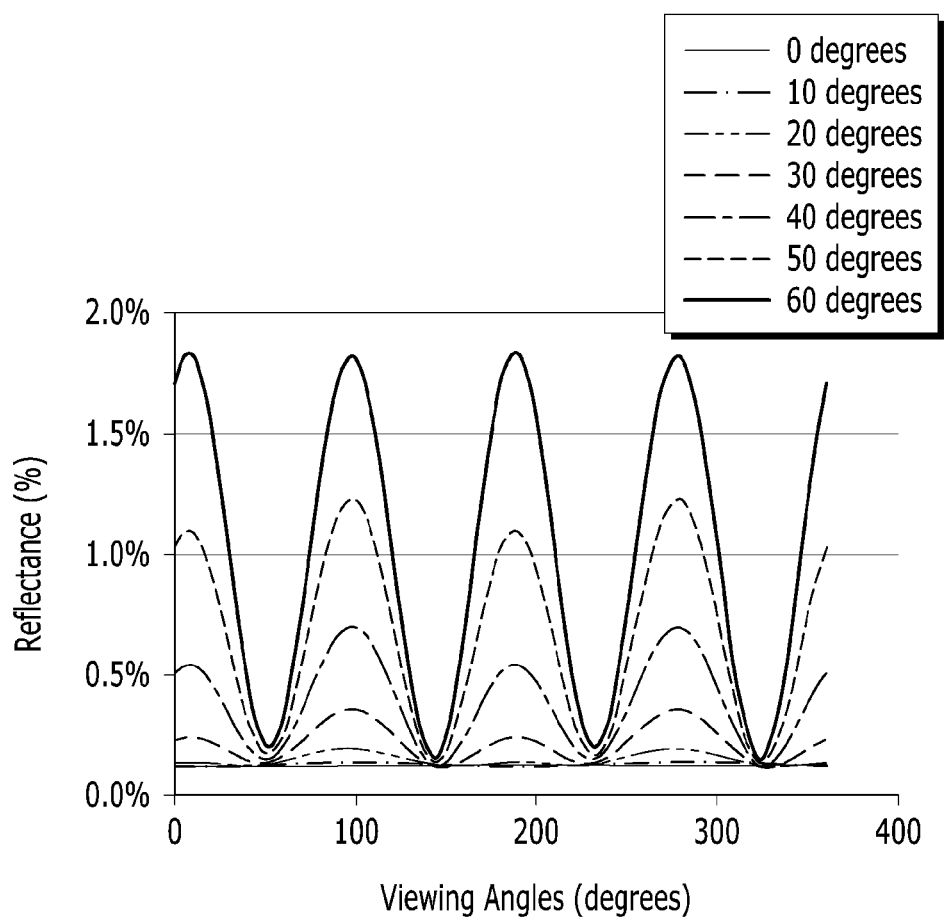
FIG. 8 is a graph showing reflectance (percentage, %) depending on a viewing angle (degrees) across all directions of the anti-reflection film according to Comparative Example 1.

The results are illustrated referring to Table 1 and FIGS. 6 to 8.

FIG. 6 is a graph showing a relationship between maximum tilt angles of liquid crystals and color shifts at about 60° viewing angles of the anti-reflection films according to Examples 1 to 8 and Comparative Examples 1, 9, and 10. FIG. 7 is a graph showing reflectance depending on a viewing angle in all directions of the anti-reflection film according to Example 2. FIG. 8 is a graph showing reflectance depending on a viewing angle in all directions of the anti-reflection film according to Comparative Example 1.

TABLE 1

| | In-plane retardation ($R_e$) (nm) At 550 nm | WD | Tilt Type | Max Tilt Angle (degrees) | Side (60°) Reflectance (%) | Color shift ($\Delta a^*b^*$) |
|---|---|---|---|---|---|---|
| Example 1 | 138 | 0.82 | B | 37 | 0.64 | 5.4 |
| Example 2 | 138 | 0.82 | B | 45 | 0.59 | 3.7 |
| Example 3 | 138 | 0.82 | B | 65 | 0.93 | 4.5 |
| Example 4 | 138 | 0.82 | T | 65 | 0.80 | 5.1 |
| Example 5 | 138 | 0.82 | B | 75 | 1.45 | 6.9 |
| Example 6 | 138 | 0.82 | B | 30 | 0.73 | 6.4 |
| Example 7 | 138 | 0.82 | T | 37 | 0.59 | 5.2 |
| Example 8 | 138 | 0.82 | T | 45 | 0.51 | 3.6 |
| Example 9 | 138 | 0.82 | T | 78 | 1.23 | 7.3 |
| Example 10 | 138 | 0.82 | T | 18 | 0.88 | 7.7 |
| Example 11 | 138 | 0.90 | T | 45 | 0.57 | 6.1 |
| Example 12 | 140 | 0.75 | T | 45 | 0.49 | 5.9 |
| Comparative Example 1 | 138 | 0.82 | — | 0 | 1.04 | 8.2 |
| Comparative Example 2 | 138 | 0.90 | — | 0 | 1.09 | 10.6 |
| Comparative Example 3 | 140 | 0.75 | — | 0 | 1.06 | 10.4 |
| Comparative Example 4 | 138 | 1.1 | B | 45 | 1.04 | 37.7 |
| Comparative Example 5 | 138 | 1.1 | T | 45 | 0.94 | 40.1 |
| Comparative Example 6 | 138 | 0.65 | B | 45 | 0.54 | 26.9 |

TABLE 1-continued

| | In-plane | | | Side (60°) | |
|---|---|---|---|---|---|
| | retardation ($R_e$) (nm) At 550 nm | WD | Tilt Type | Max Tilt Angle (degrees) | Reflectance (%) | Color shift ($\Delta a^* b^*$) |
| Comparative Example 7 | 138 | 0.82 | T | 13 | 0.94 | 8.0 |
| Comparative Example 8 | 138 | 0.82 | T | 83 | 1.67 | 8.6 |
| Comparative Example 9 | 138 | 0.82 | B | 90 | 2.71 | 9.3 |
| Comparative Example 10 | 138 | 0.82 | T | 90 | 2.06 | 9.2 |

* B: Bottom Tilt Structure, T: Top Tilt Structure

Referring to Table 1 and FIG. 6, the anti-reflection films according to Examples 1 to 12 showed remarkably lower color shift at the side (e.g., 60°) than the anti-reflection film according to Comparative Example 1.

In addition, referring to FIGS. 7 and 8, the anti-reflection film according to Example 2 shows low reflectance in every direction (0° to 360°) compared with the anti-reflection films according to Comparative Example 1. In FIGS. 7 and 8, the horizontal axis is the azimuth angles of reflection evaluation and the angles in the legend refer to the inclination angles of reflection evaluation from the perpendicular direction to the film plane.

Accordingly, the anti-reflection films according to Examples 1 to 12 improve visibility at the side without increasing a thickness of the anti-reflection film.

While this invention has been described in connection with what is presently considered to be practical exemplary embodiments, it is to be understood that the invention is not limited to the disclosed exemplary embodiments, but, on the contrary, is intended to cover various modifications and equivalent alignments included within the spirit and scope of the appended claims.

What is claimed is:

1. An optical film having anti-reflection properties, the optical film comprising:
   a polarizer; and
   a compensation film positioned on the polarizer and comprising a liquid crystal layer having a first side and a second side facing each other,
   wherein the liquid crystal layer comprises liquid crystals oriented in a direction tilting obliquely with respect to a surface of the first side or the second side of the liquid crystal layer, the surface extending in a horizontal direction in a cross sectional view,
   tilt angles of the liquid crystals are gradually larger from the first side to the second side,
   a maximum tilt angle of the liquid crystals with respect to the surface of the liquid crystal layer is from about 15° to about 80°, and
   in-plane retardation ($R_e$) of the liquid crystal layer for incident light of a 450 nm wavelength and a 550 nm wavelength satisfies a following Relationship 1:

$$0.7 \leq R_e(450 \text{ nm})/R_e(550 \text{ nm}) < 1.0 \quad \text{Relationship 1}$$

wherein, in the Relationship 1,
   $R_e$ (450 nm) is in-plane retardation for incident light of the 450 nm wavelength, and
   $R_e$ (550 nm) is in-plane retardation for incident light of the 550 nm wavelength.

2. The optical film of claim 1, wherein the first side of the liquid crystal layer faces the polarizer.

3. The optical film of claim 1, wherein the second side of the liquid crystal layer faces the polarizer.

4. The optical film of claim 1, wherein the compensation film further comprises an alignment layer contacting the liquid crystal layer.

5. The optical film of claim 1, wherein the compensation film has in-plane retardation ($R_e$) of about 120 nm to about 160 nm for incident light of the 550 nm wavelength.

6. The optical film of claim 1, wherein in-plane retardation ($R_e$) of the liquid crystal layer for incident light of the 450 nm wavelength, the 550 nm wavelength, and a 650 nm wavelength satisfies a following Relationship 2:

$$R_e(450 \text{ nm}) < R_e(550 \text{ nm}) \leq R_e(650 \text{ nm}) \quad \text{Relationship 2}$$

wherein, in the Relationship 2,
   $R_e$ (450 nm) is in-plane retardation for incident light of the 450 nm wavelength,
   $R_e$ (550 nm) is in-plane retardation for incident light of the 550 nm wavelength, and
   $R_e$ (650 nm) is in-plane retardation for incident light of the 650 nm wavelength.

7. The optical film of claim 1, wherein a color shift of the optical film at a viewing angle of about 60° is less than or equal to about 7.8.

8. An organic light emitting device comprising
   an organic light emitting display panel; and
   an anti-reflection film comprising:
   a polarizer, and
   a compensation film positioned on the polarizer and comprising a liquid crystal layer having a first side and a second side facing each other,
   wherein the liquid crystal layer comprises liquid crystals oriented in a direction tilting obliquely with respect to a surface the first side or the second side of the liquid crystal layer, the surface extending in a horizontal direction in a cross sectional view,
   tilt angles of the liquid crystals are gradually larger from the first side to the second side,
   a maximum tilt angle of the liquid crystals with respect to the surface of the liquid crystal layer is from about 15° to about 80°, and
   in-plane retardation ($R_e$) of the liquid crystal layer for incident light of a 450 nm wavelength and a 550 nm wavelength satisfies a following Relationship 1:

$$0.7 \leq R_e(450 \text{ nm})/R_e(550 \text{ nm}) < 1.0 \quad \text{Relationship 1}$$

wherein, in the Relationship 1,
   $R_e$ (450 nm) is in-plane retardation for incident light of the 450 nm wavelength, and
   $R_e$ (550 nm) is in-plane retardation for incident light of the 550 nm wavelength.

9. The organic light emitting device of claim 8, wherein the compensation film is positioned between the polarizer and the organic light emitting display panel,
   the first side of the liquid crystal layer is positioned at a same side as the polarizer, and
   the second side of the liquid crystal layer is positioned at a same side as the organic light emitting display panel.

10. The organic light emitting device of claim 8, wherein the compensation film is positioned between the polarizer and the organic light emitting display panel,
   the first side of the liquid crystal layer is positioned at a same side as the organic light emitting display panel, and the second side of the liquid crystal layer is positioned at a same side as the polarizer.

11. The organic light emitting device of claim 8, wherein the compensation film further comprises an alignment layer contacting the liquid crystal layer.

12. The organic light emitting device of claim 8, wherein the compensation film has an in-plane retardation ($R_e$) of about 120 nm to about 160 nm for incident light of the 550 nm wavelength.

13. The organic light emitting device of claim 8, wherein in-plane retardation ($R_e$) of the liquid crystal layer for incident light of the 450 nm wavelength, the 550 nm wavelength, and a 650 nm wavelength satisfies a following Relationship 2:

$$R_e(450 \text{ nm}) < R_e(550 \text{ nm}) \leq R_e(650 \text{ nm}) \quad \text{Relationship 2}$$

wherein, in the Relationship 1,
$R_e$ (450 nm) is in-plane retardation for incident light of the 450 nm wavelength,
$R_e$ (550 nm) is in-plane retardation for incident light of the 550 nm wavelength, and
$R_e$ (650 nm) is in-plane retardation for incident light of the 650 nm wavelength.

14. The organic light emitting device of claim 8, wherein a color shift of the anti-reflection film at a viewing angle of about 60° is less than or equal to about 7.8.

15. The optical film of claim 1, wherein the optical film is an anti-reflection film.

* * * * *